United States Patent [19]

Verhaege et al.

[11] Patent Number: 5,168,125
[45] Date of Patent: Dec. 1, 1992

[54] SUPERCONDUCTOR PROTECTED AGAINST PARTIAL TRANSITION

[75] Inventors: Thierry Verhaege, Saulx les Chartreux; Van Doan Pham, Meyzieu; Alain Lacaze, Essert, all of France

[73] Assignee: GEC Alsthom SA, Paris, France

[21] Appl. No.: 645,771

[22] Filed: Jan. 25, 1991

[30] Foreign Application Priority Data

Jan. 29, 1990 [FR] France .................. 90 00992

[51] Int. Cl.$^5$ ............................................. H01B 12/00
[52] U.S. Cl. .................................. 174/125.1; 505/813; 505/884; 505/886; 505/887
[58] Field of Search ................... 174/15.4, 15.5, 125.1; 505/812, 813, 884, 885, 886, 887

[56] References Cited

FOREIGN PATENT DOCUMENTS 0156626 10/1985 European Pat. Off. .
0230567 8/1987 European Pat. Off. .

OTHER PUBLICATIONS

IEEE Transactions on Magnetics, vol. 25, No. 2, Mar. 1989, pp. 1484–1487, New York, USA; & Applied Superconductivity Conference, San Francisco, USA Aug. 21–25, 1988; H. Tsuji et al.: "Recent progress in the demo poloidal coil program".

Primary Examiner—Leo P. Picard
Assistant Examiner—Bot L. Ledynh
Attorney, Agent, or Firm—Sughrue, Mion, Zinn, Macpeak & Seas

[57] ABSTRACT

A superconductor protected against partial transition includes superconductor strands around at least one non-superconductor central strand or at least one non-superconductor central core electrically insulated from the superconductor strands. At least at both ends of the superconductor, the central strand or said central core is electrically connected to the superconductor strand. The central strand or the central core comprises at least one non-superconductor metal filament whose resistivity at 4.2° K. is less than $10^{-9}$ Ω.m embedded in a metal alloy matrix whose resistivity at that temperature is greater than $10^{-8}$ Ω.m.

5 Claims, 2 Drawing Sheets

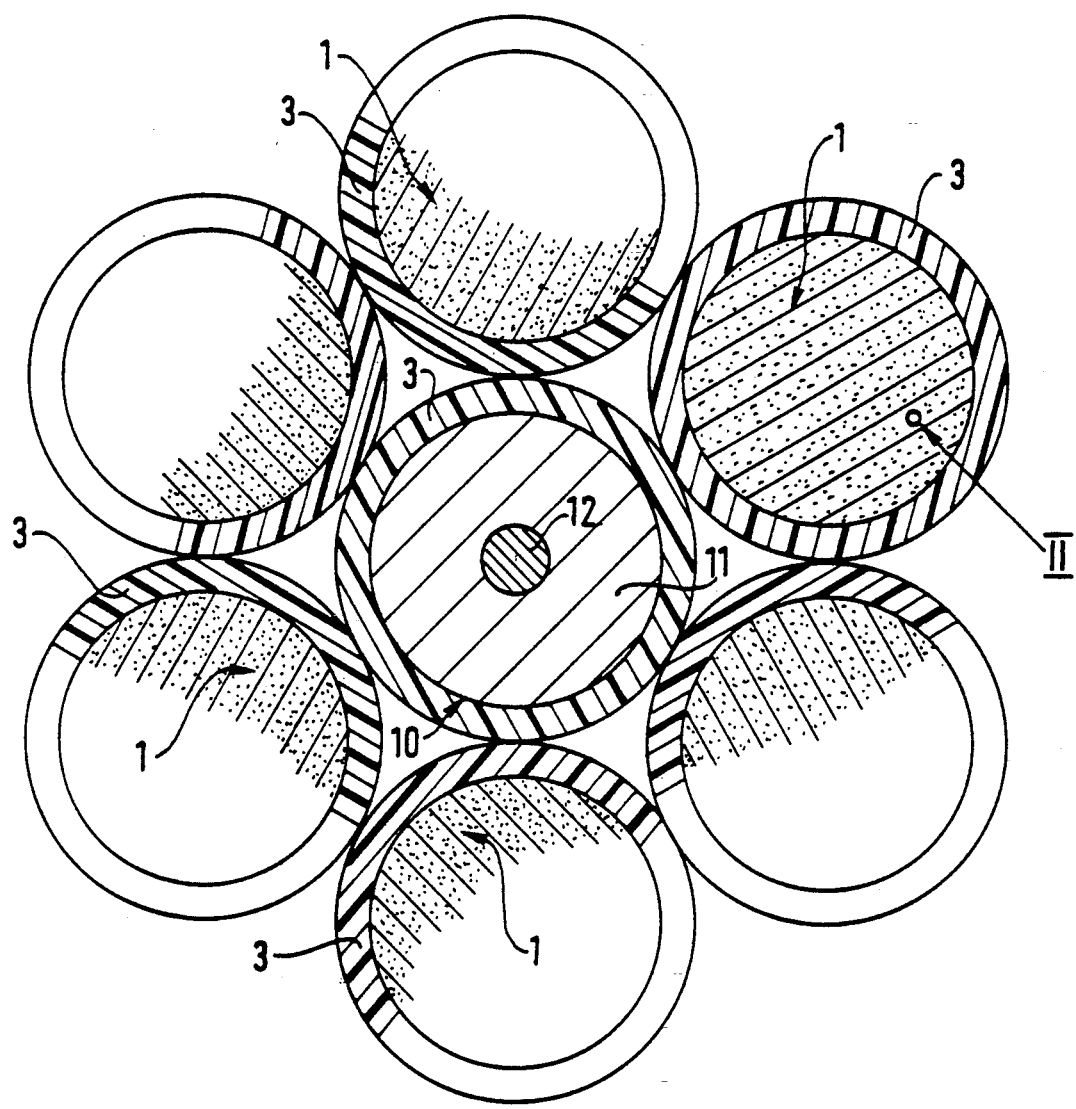
FIG.1
FIG.2
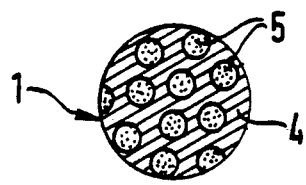

SUPERCONDUCTOR PROTECTED AGAINST PARTIAL TRANSITION

BACKGROUND OF THE INVENTION

1. Field of the Invention

The present invention concerns a superconductor and in particular a superconductor protected against partial transition.

2. Description of the Prior Art

The meaning of the terms "superconductor", "strand" and "filament" will first be explained.

The term "superconductor" refers to an assembly of separable members which in this context are the "strands". The strand is the smallest separable component. A superconductor strand is formed from superconductor "filaments" embedded in a metal matrix. The central strand or the central core is a metal composite.

The "filament" is a homogeneous subset of the composite strand.

There are various known superconductor configurations.

In the case of multistrand superconductors, the superconductor strands may be twisted around a central strand which is a superconductor or stainless steel or copper alloy, possibly with an insulating jacket.

European patent No 0037544 describes another kind of flat multistrand superconductor configuration having a central core in the form of a copper strip provided with an insulating "separator".

It is known that superconductors can undergo partial transitions either accidentally or under specific operating conditions; these "partial transitions" are changes of a limited area of the superconductor to the resistive state; this area is initially very small and then expands due to heating as a result of the Joule effect. The superconductor may be damaged by the rapid and intense heating and the high voltages which are produced across the transition area.

To moderate the effects of partial transitions the superconductor strands are usually provided with a matrix comprising a high proportion (up to 80% or even 90%) of a metal that is a good superconductor, such as copper or aluminum; steps are then taken to detect the transition and to reduce the current as quickly as possible. The reaction time and the time needed to reduce the current are sometimes too long for it to be possible to avoid overheating or overvoltages likely to damage the strands.

In the article in IEEE TRANSACTIONS ON MAGNETICS, Vol.MAG.17 No 5, September 1981: "High sensitive quench detection method using an integrated test wire", there is described a superconductor protection device comprising a strand or a central core in copper-nickel alloy on which is provided a voltage detector associated with signal processing means to introduce into the superconductor circuit resistances to reduce the current.

The complexity of a protection device of this kind multiplies the risk of failure.

An object of the present invention is to avoid the disadvantages and to enable simpler and more effective protection of superconductors.

SUMMARY OF THE INVENTION

The present invention consists in a superconductor protected against partial transition comprising superconductor strands around at least one non-superconductor central strand or at least one non-superconductor central core electrically insulated from said superconductor strands, wherein at least at both ends of said superconductor said central strand or said central core is electrically connected to said superconductor strand and said central strand or said central core comprises at least one non-superconductor metal filament whose resistivity at 4.2° K. is less than $10^{-9}$ $\Omega.m$ embedded in a metal alloy matrix whose resistivity at said temperature is greater than $10^{-8}$ $\Omega.m$.

Said non-superconductor metal is preferably a highly pure non-alloy metal such as type. CuOFHC or CuC2 aluminum or copper.

Its resistivity at low temperature may, if required, be reduced by appropriate heat treatment, to values in the order of $10^{-10}$ $\Omega.m$. This type of material has the advantage of having a resistivity that is highly temperature-dependent, for example, 100 times greater at 300° K. than at 4.2° K.

Said metal alloy is preferably copper-nickel alloy containing 30% nickel; its resistivity is in the vicinity of $4 \times 10^{-8}$ $\Omega.m$ at all temperatures. If $p_0$ denotes the percentage of low resistivity metal in the central strand or the central core and $p_1$ denotes the percentage of low resistivity metal in the superconductor strands, then the values of $p_0$ and $p_1$ are preferably chosen such that:

for $0 < _1 < 0.5\%$, $1\% < p_0 < 10\%$, for $0.5\% < p_1 < 20\%$, $2 p_1 < p_0 < 5 p_1$.

When a partial transition starts, the central strand shunts part of the current, is heated and as a result of thermal diffusion heats the surrounding superconductor strands along all of their length between the electrical contacts. This phenomenon quickly results in transition of the superconductor strands over all the length in question.

The resistance of the central strand increases rapidly with temperature and the strands that have undergone transition also have a high resistance, with the result that the decrease in the current may be sufficient to avoid all risk of damage.

The above choice of values for $p_0$ and $p_1$ represents a compromise between the risk of damage to the superconductor strand and the risk of the damage to the central strand. If the value of $p_0$ is too low for a given value of $p_1$, the Joule effect in the central strand is reduced so that heating and transition are retarded. However, if the value of $p_0$ is too high for a given value of $p_1$, the intense Joule effect may destroy the central strand.

If necessary, the flow of current in the central strand may serve as a signal to command the insertion of additional series resistances into the circuit. This provides an additional external protection circuit that is simpler than the prior art protection devices.

The overall quantity of energy dissipated in a superconductor in accordance with the invention is high, but it is better distributed and the maximum temperature reached is considerably reduced.

In one embodiment, the superconductor in accordance with the invention comprises two non-superconductor strands of the type previously defined respectively connected electrically to points $P_i$ and $P'_i$ of said superconductor strands, each point $P'_i$ between two points $P_i$.

Complete transition is secured by a cascade reaction from one section to the next.

Other characteristics and advantages of the present invention will emerge from the following description of embodiments thereof given by way of purely illustrative non-limiting examples.

BRIEF DESCRIPTION OF THE DRAWINGS

FIG. 1 is a highly schematic view in cross-section of one embodiment of superconductor in accordance with the invention to a scale of ×200.

FIG. 2 is a schematic enlarged view (scale ×20000) of the detail marked II in FIG. 1.

DETAILED DESCRIPTION OF THE INVENTION

Figure 3A:
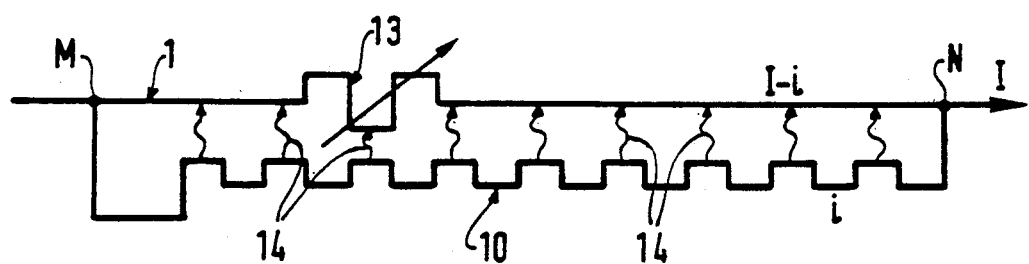
FIG. 3A is a highly simplified diagram showing the operation of the superconductor from FIGS. 1 and 2 in the case of transition.

FIG. 1 shows a stranded superconductor assembly comprising six superconductor strands 1 surrounding a non-superconductor strand 10.

Each strand 1 comprises (see FIG. 2) a copper-nickel alloy matrix 4 and niobium-titanium filaments 5; it is surrounded by an electrically insulative jacket 3. The percentage $p_1$ of copper in the strands 1 is 0%.

The central strand 10 comprises a copper filament 12 surrounded by a copper-nickel alloy matrix 11; it also has an electrically insulative jacket 3. The percentage $p_0$ of copper in the strand 10 is 5%.

As shown very schematically in FIG. 3A, the strand 10 is connected electrically to both ends M and N of the strands 1. In the event of partial transition in the area 13 of a strand 1, the strand 10 shunts a part i of the current i, is heated and by thermal diffusion heats the strands 1 (arrows 14). An increase in temperature of a few degrees K of the strands 1 is sufficient to cause them to undergo transition over all of the length between M and N. The resistivity of the central strand then increases with temperature with the result that the current i is reduced and the heating of the central strand is slowed down.

Figure 3B:
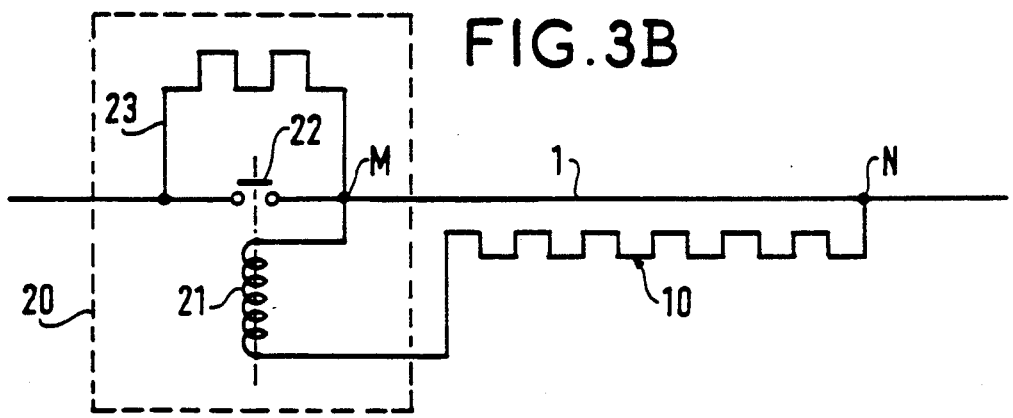
FIG. 3B is a variant of the FIG. 3A diagram.

For additional safety an external protection device 20 may be added as shown in FIG. 3B. This is an extremely simple device comprising a coil 21 in series with the strand 1 and which, in response to the passage of a current i, opens a contact 22 which connects in series resistances 23.

Figure 4:
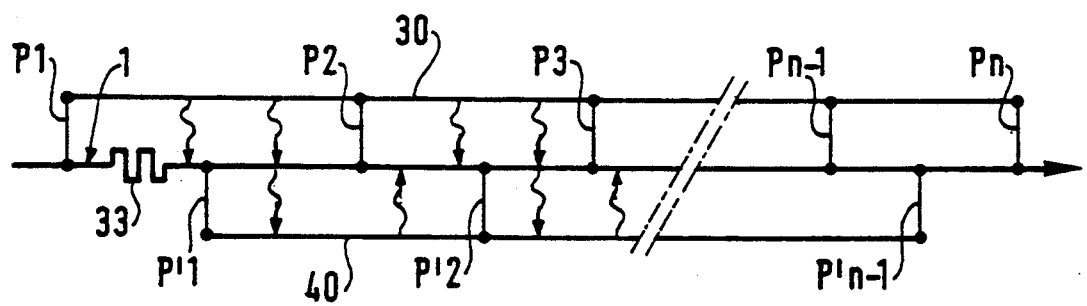
FIG. 4 is a highly simplified diagram of one embodiment of superconductor in accordance with the invention.

In the FIG. 4 diagram the strands 1 surround two non-superconductor strands 30 and 40. If $P_1$ and $P_n$ are the ends of the strand 1, the strand 30 is connected to the strands 1 at these points, and also at intermediate points $P_2 \ldots P_{n-1}$. The strand 40 is connected to the strand 1 at other points $P'_1 \ldots P'_{n-1}$.

In the event of partial transition in the area 33 of the strands 1, thermal exchanges and transitions occur in cascade in the area $P_1 P'_1 P_2$, then in the area $P'_1 P_2 P'_2$ ... and so on up to $P_n$.

Of course, the invention is not limited to the embodiments described.

The invention applies to all superconductor strand configurations usable with direct current or at industrial frequencies.

There is claimed:

1. Superconductor protected against partial transition comprising superconductor strands around at least one non-superconductor central strand electrically insulated from said superconductor strands, wherein, at least at both ends of said superconductor, said at least one central strand is electrically connected to said superconductor strands and said at least one central strand comprises at least one non-superconductor low resistivity metal filament whose resistivity at 4.2° K. is less than $10^{-9}$ $\Omega$.m embedded in a metal alloy matrix whose resistivity at said temperature is greater than $10^{-8}$ $\Omega$.m.

2. Superconductor according to claim 1 wherein said low resistivity metal is a highly pure non-alloyed metal selected from the group consisting of CuOFHC type aluminum, or CuC2 type aluminum and copper.

3. Superconductor according to claim 1 wherein the proportions $P_0$ and $P_1$ of the low resistivity metal respectively present in said at least one central strand and in the superconductor strand are chosen so that:

for $0 < p_1 < 0.5\%$, $1\% < p_0 < 10\%$,
and for $0.5\% < p_1 < 20\%$, $2 p_1 < p_0 5 p_1$.

4. Superconductor according to claim 1 wherein said at least one central strand comprises two non-superconductor central strands respectively connected electrically to points $P_i$ and $P'_i$ of said superconductor strands, each point $P_i$ being between two points $P'_i$.

5. Superconductor according to claim 1 associated with an additional protection device comprising a coil in series with said at least one non-superconductor central strand and adapted to command the series connection of additional protection resistances.

* * * * *